United States Patent
Chen et al.

(10) Patent No.: US 12,543,404 B2
(45) Date of Patent: Feb. 3, 2026

(54) METHOD FOR MANUFACTURING DISPLAY DEVICE

(71) Applicant: InnoLux Corporation, Miao-Li County (TW)

(72) Inventors: Jia-Yuan Chen, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 559 days.

(21) Appl. No.: 17/985,921

(22) Filed: Nov. 14, 2022

(65) Prior Publication Data

US 2023/0178681 A1 Jun. 8, 2023

(30) Foreign Application Priority Data

Dec. 8, 2021 (CN) .......................... 202111512424.2

(51) Int. Cl.
*H10H 20/01* (2025.01)
*H01L 25/075* (2006.01)

(52) U.S. Cl.
CPC ......... *H10H 20/01* (2025.01); *H01L 25/0753* (2013.01); *H10H 20/0364* (2025.01)

(58) Field of Classification Search
CPC .. H10H 20/01; H10H 20/0364; H10H 29/142; H01L 25/0753
See application file for complete search history.

(56) References Cited

U.S. PATENT DOCUMENTS

| | | | |
|---|---|---|---|
| 2013/0301257 A1* | 11/2013 | Britt | H01L 25/0753 362/249.02 |
| 2020/0020740 A1 | 1/2020 | Kwag | |
| 2020/0161159 A1 | 5/2020 | Park | |
| 2020/0168498 A1* | 5/2020 | Marinov | B23K 26/0673 |
| 2020/0279835 A1* | 9/2020 | Sasaki | H01L 21/6835 |
| 2020/0313035 A1* | 10/2020 | Lee | H01L 24/32 |
| 2020/0395503 A1* | 12/2020 | Wu | H01L 24/27 |
| 2020/0395521 A1* | 12/2020 | Brodoceanu | H01L 24/83 |
| 2020/0410949 A1* | 12/2020 | Yeh | G02F 1/1368 |

(Continued)

FOREIGN PATENT DOCUMENTS

| | | | | |
|---|---|---|---|---|
| CN | 112018224 A | | 12/2020 | |
| JP | 2010109170 A | * | 5/2010 | ............. H05K 1/183 |

OTHER PUBLICATIONS

Liu, Zhaojun, and et al. "Micro-light-emitting diodes with quantum dots in display technology." Light: Science & Applications 9, No. 1 (2020): 83 (Year: 2020).*

*Primary Examiner* — Douglas Kay
(74) *Attorney, Agent, or Firm* — Winston Hsu

(57) ABSTRACT

A method for manufacturing a display device is disclosed. The method includes providing a plurality of first light-emitting units and a plurality of second light-emitting units, the first light-emitting units and the second light-emitting units configured to emit light with different colors; obtaining an optical character of each of the first light-emitting units and the second light-emitting units; predetermining a target color point for the display device; and transferring a portion of the first light-emitting units and a portion of the second light-emitting units to a target substrate based on the obtained optical characters for aligning a color point of the display device with the target color point.

17 Claims, 12 Drawing Sheets

(56) References Cited

U.S. PATENT DOCUMENTS

| | | | |
|---|---|---|---|
| 2021/0375979 A1* | 12/2021 | Cok | H10H 29/10 |
| 2022/0076983 A1* | 3/2022 | Marinov | B23K 26/36 |
| 2025/0087146 A1* | 3/2025 | Yamazaki | H04N 17/04 |

* cited by examiner

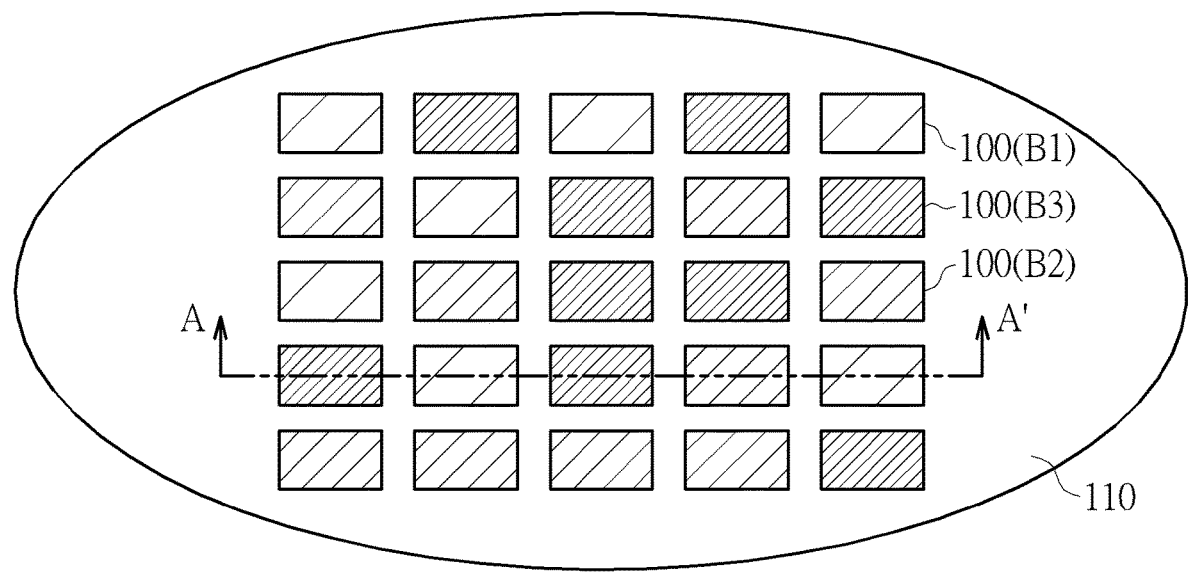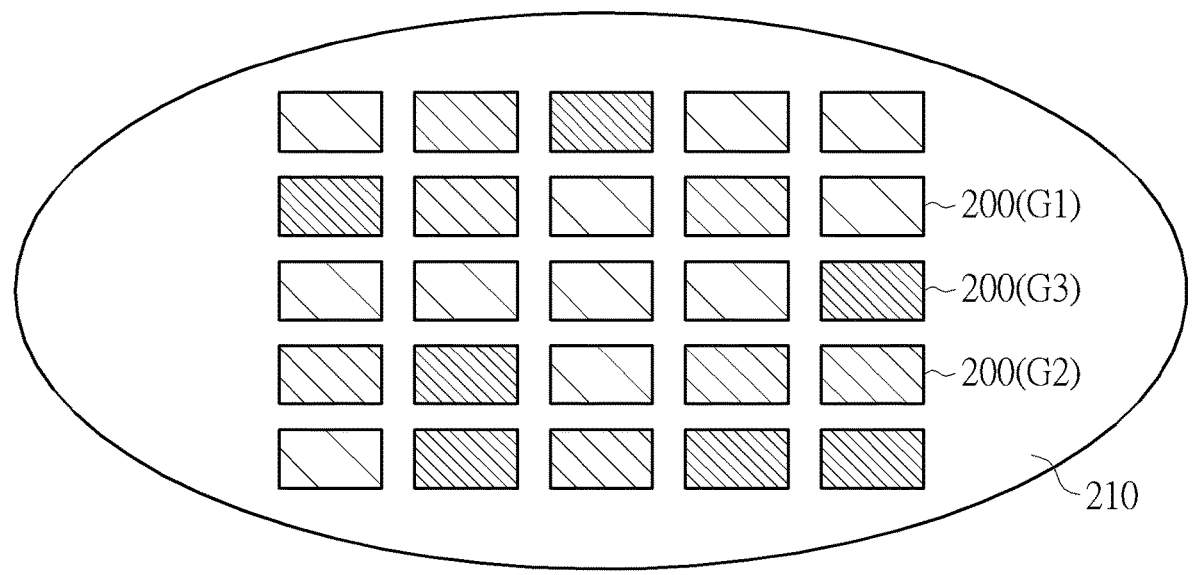
FIG. 2

METHOD FOR MANUFACTURING DISPLAY DEVICE

BACKGROUND OF THE DISCLOSURE

1. Field of the Disclosure

The present disclosure relates to a method for manufacturing a display device, and more particularly to a method for aligning a color point of a display device with a predetermined target color point.

2. Description of the Prior Art

In recent years, display devices have become more and more important in various electronic applications, which can be applied to vehicle displays, wearable devices (e.g., smart watches), smart phones, tablets, notebook computers and e-book readers. Multiple light-emitting elements may be disposed in a display device, and the light emitted by the light-emitting elements may have a color point after being mixed.

However, in a manufacturing process of multiple light-emitting elements, the uniformity of epitaxy may be affected by factors such as the process conditions, film thickness or defects, resulting in that lights emitted by different light emitting elements have deviations of optical characteristics (e.g., wavelengths and/or luminance). When manufacturing a display device, the color of the display image may be uneven if these light-emitting elements with different optical characteristics are used. However, if only the light-emitting elements with the same optical characteristic are used, the utilization rate of the light-emitting elements may be reduced, or great differences or deviations may exist between the display images of the manufactured display devices because the results of light mixing are not be considered.

SUMMARY OF THE DISCLOSURE

One of objectives of the present disclosure is to provide a method for manufacturing a display device, so as to solve the problems encountered by the conventional manufacturing methods of display devices, thereby aligning a color point of the display device with a target color point.

An embodiment of the present disclosure provides a method for manufacturing a display device. The method includes: providing a plurality of first light-emitting units and a plurality of second light-emitting units, the first light-emitting units and the second light-emitting units configured to emit light with different colors; obtaining an optical character of each of the first light-emitting units and the second light-emitting units; predetermining a target color point for the display device; and transferring a portion of the first light-emitting units and a portion of the second light-emitting units to a target substrate based on the obtained optical characters for aligning a color point of the display device with the target color point.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 2 is a top-view schematic diagram of first light-emitting units and second light-emitting units respectively on growth substrates according to an embodiment of the present disclosure.

DETAILED DESCRIPTION

Figure 1:
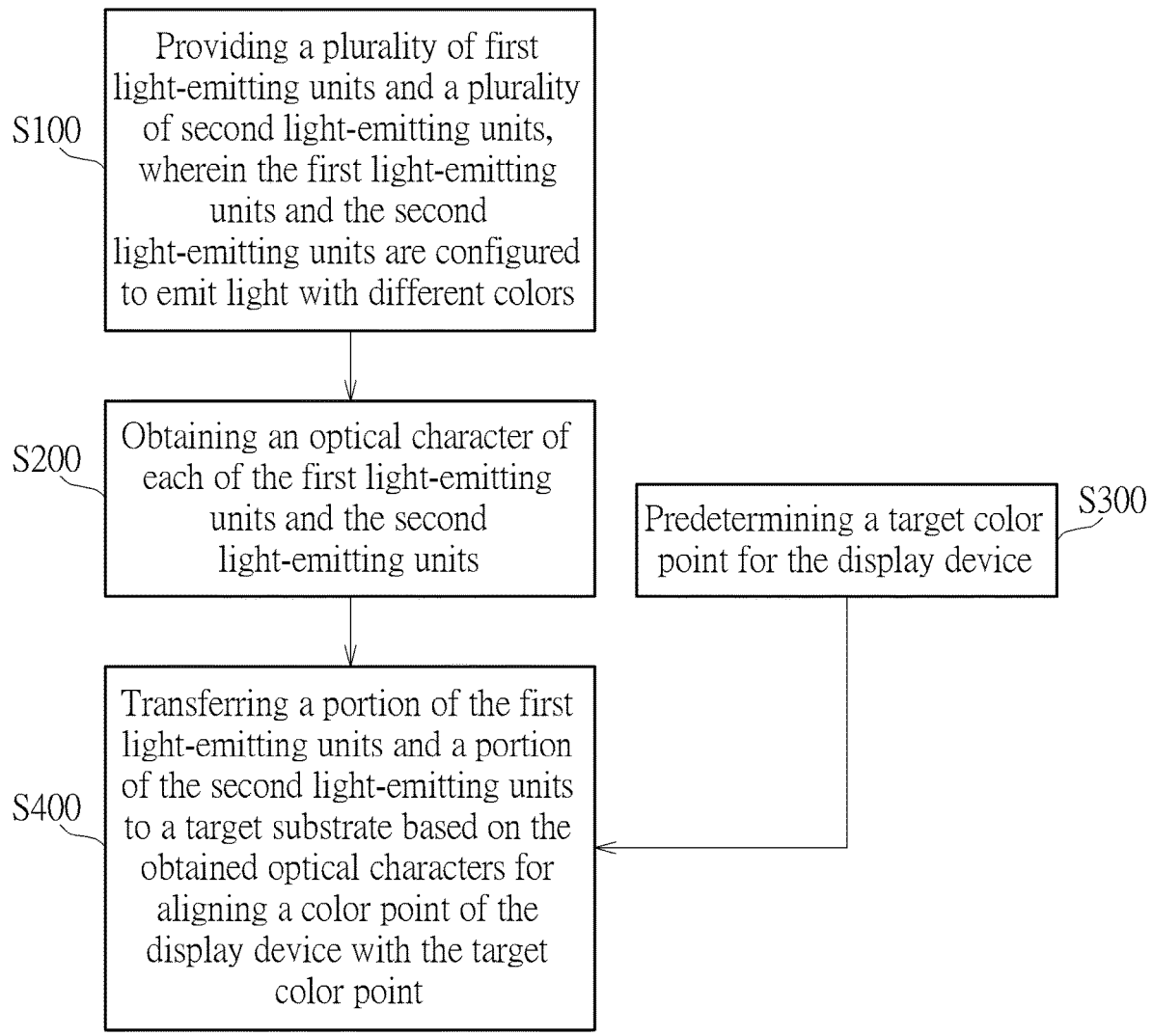
FIG. 1 is a flowchart of a method for manufacturing a display device according to an embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". When the terms "include", "comprise" and/or "have" are used in the description of the present disclosure, the corresponding features, areas, steps, operations and/or components would be pointed to existence, but not limited to the existence or addition of one or a plurality of the corresponding or other features, areas, steps, operations and/or components.

When an element or layer is referred to as being "on" or "connected to" another element or layer, it may be directly on or directly connected to the other element or layer, or intervening elements or layers may be presented (indirect condition). In contrast, when an element is referred to as being "directly on" or "directly connected to" another element or layer, there are no intervening elements or layers presented.

The terms "about", "equal", "identical" or "the same", and "substantially" or "approximately" mentioned in this document generally mean being within 20% of a given value or range, or being within 10%, 5%, 3%, 2%, 1% or 0.5% of a given value or range.

The display device of the present disclosure may be applied to an electronic device, and the display device may be a non-self-emissive display device or a self-emissive display device. In addition, the electronic device may further include a backlight device, an antenna device, a sensing device or a tiled device, but not limited herein. The antenna device may be a liquid crystal antenna device or an antenna device without liquid crystal, and the sensing device may be a sensing device used for sensing capacitance, light, heat or ultrasonic waves, but not limited herein. The electronic elements may include passive elements and active elements, such as capacitors, resistors, inductors, diodes, transistors, etc. The diodes may include light-emitting diodes or photodiodes. The light-emitting diodes may include, for example, organic light-emitting diodes (OLEDs), mini light-emitting diodes (mini LEDs), micro light-emitting diodes (micro LEDs), or quantum dot light-emitting diodes (quantum dot LEDs), but not limited herein. The tiled device may be, for example, a display tiled device or an antenna tiled device, but not limited herein. It should be noted that the electronic device may be any arrangement and combination of the above, but not limited herein.

It should be noted that the technical features in different embodiments described in the following can be replaced, recombined, or mixed with one another to constitute another embodiment without departing from the spirit of the present disclosure.

Figure 3:
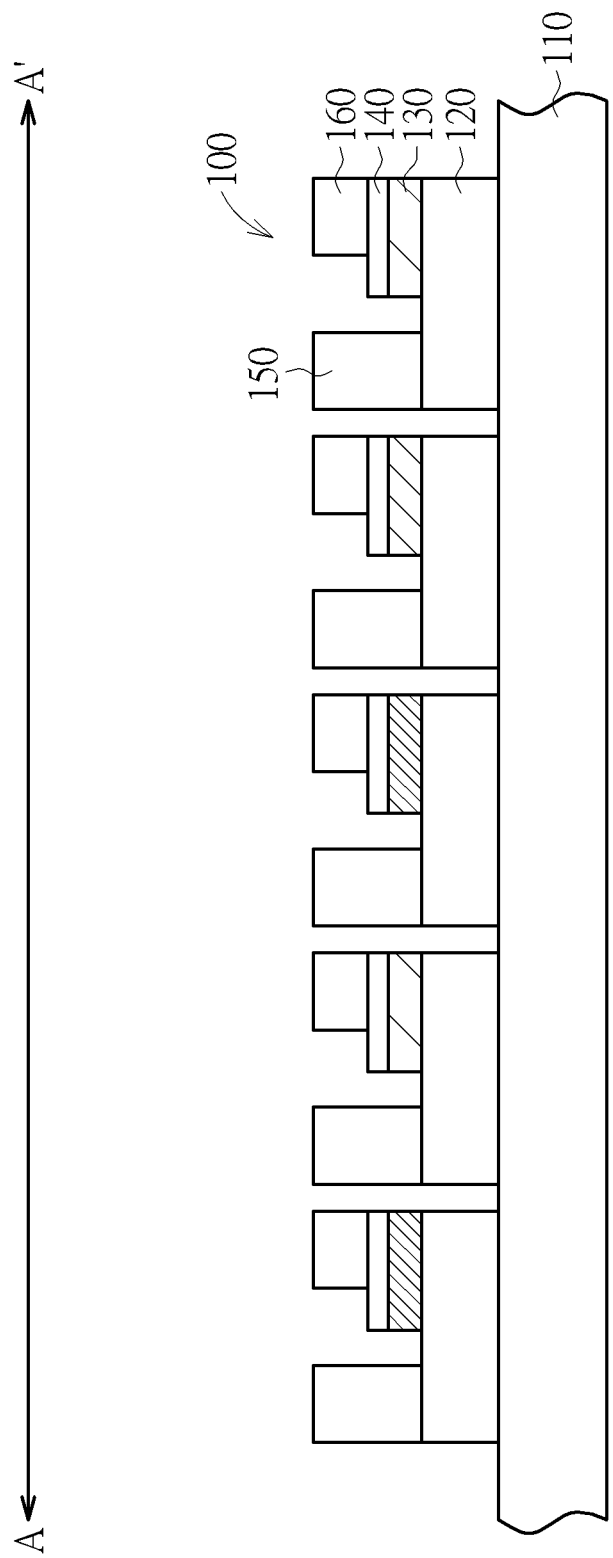
FIG. 3 is a cross-sectional schematic diagram of first light-emitting units according to an embodiment of the present disclosure.
Figure 4:
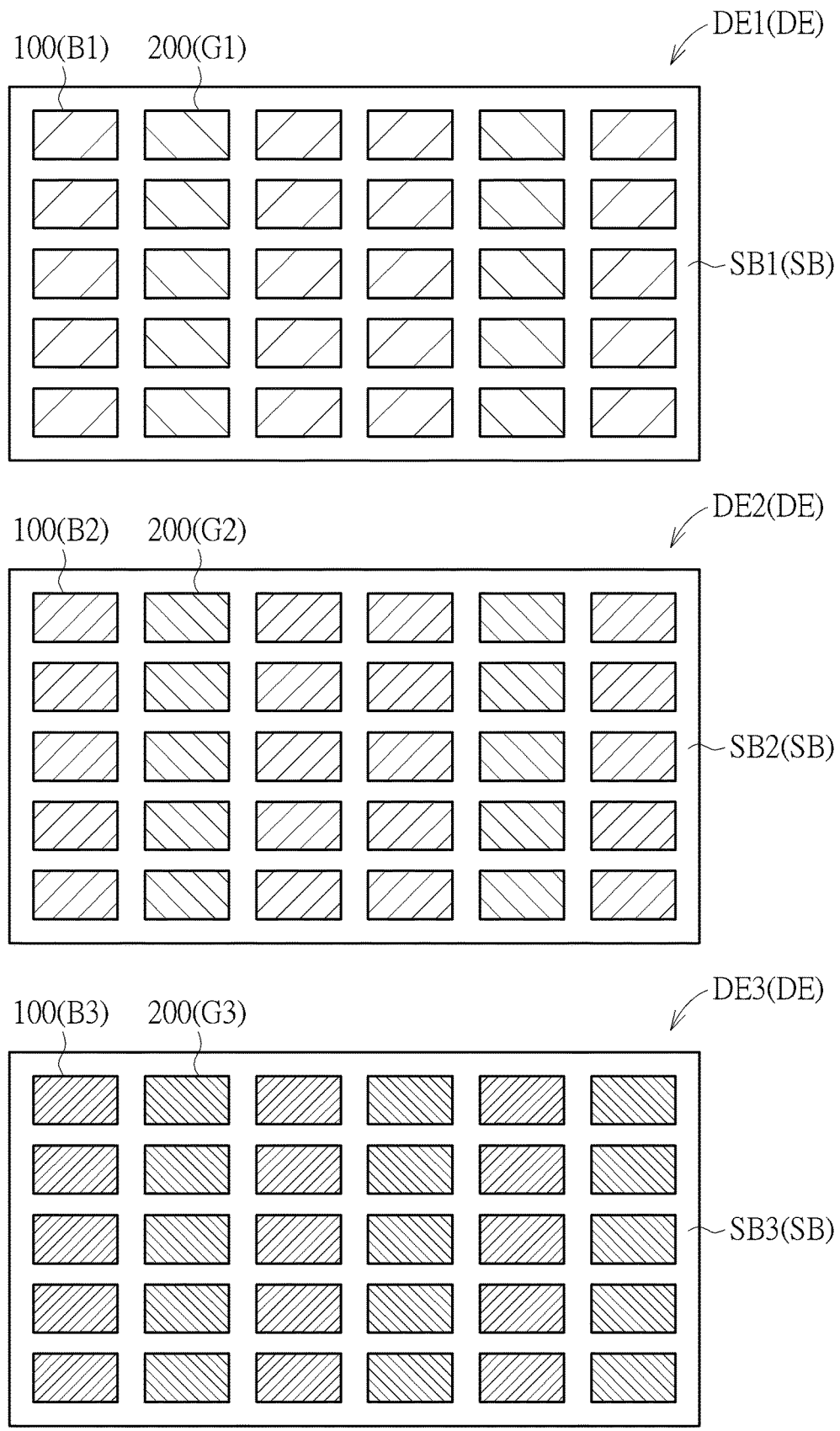
FIG. 4 is a top-view schematic diagram of a display device according to some embodiments of the present disclosure.

Please refer to FIG. 1 to FIG. 4. FIG. 1 is a flowchart of a method for manufacturing a display device according to an embodiment of the present disclosure. FIG. 2 is a top-view schematic diagram of first light-emitting units and second light-emitting units respectively on growth substrates according to an embodiment of the present disclosure. FIG. 3 is a cross-sectional schematic diagram of first light-emitting units according to an embodiment of the present disclosure, such as a cross-sectional view corresponding to the section line A-A' in FIG. 2. FIG. 4 is a top-view schematic diagram of a display device according to some embodiments of the present disclosure. As shown in FIG. 1 to FIG. 4, a method for manufacturing a display device DE according to an embodiment of the present disclosure may include steps as follows. As shown in the step S100 and FIG. 2, a plurality of first light-emitting units 100 and a plurality of second light-emitting units 200 are provided, and the first light-emitting units 100 and the second light-emitting units 200 are configured to emit light with different colors.

According to some embodiments, "emitting light with different colors" herein may mean that a difference between the wavelengths corresponding to the maximum peaks in the spectrum diagrams of the light respectively emitted by the first light-emitting units 100 and the second light-emitting units 200 (referred to as peak wavelength values in the following) is greater than or equal to 30 nanometers (nm), or it may mean that a person of ordinary skill in the art may substantially clearly distinguish the light respectively emitted by the first light-emitting units 100 and the second-light emitting units 200 as light with different colors by viewing with naked eyes. For example, the first light-emitting units 100 may be configured to emit blue light, and the second light-emitting units 200 may be configured to emit green light or red light, but not limited herein.

Figure 8:
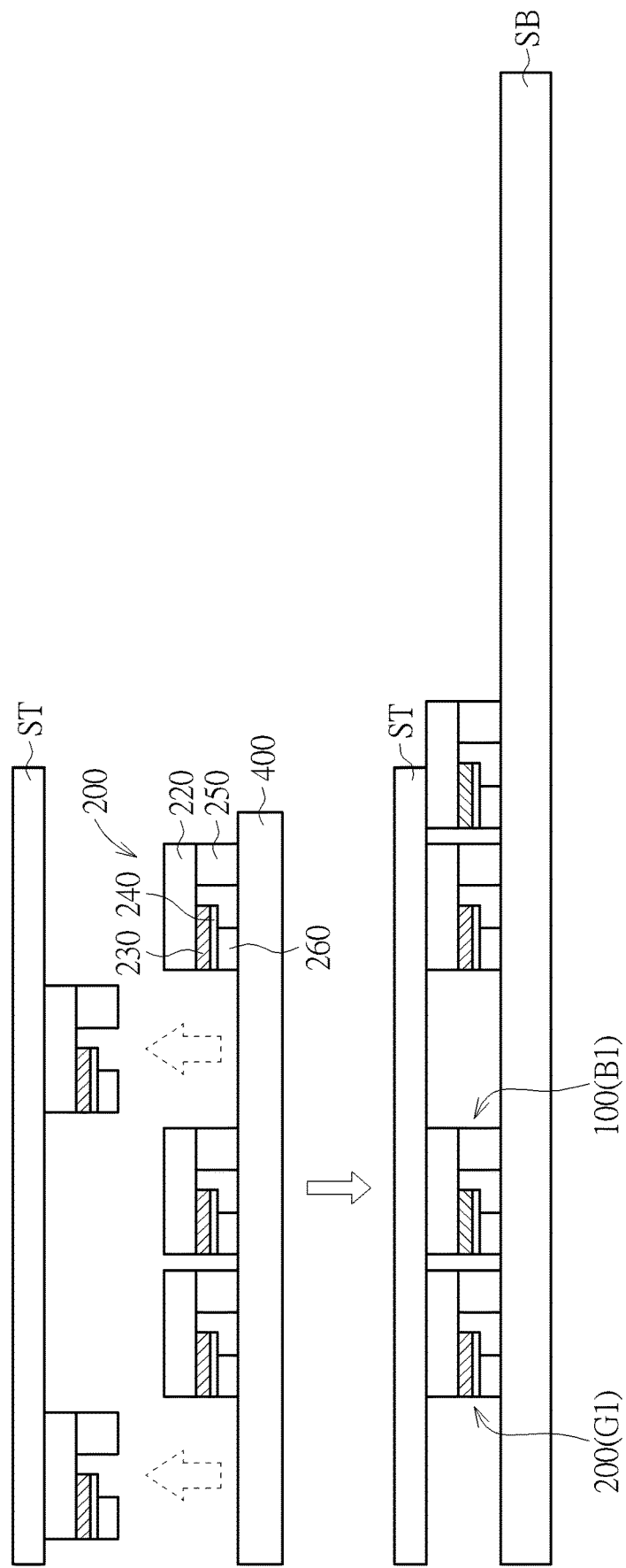

In some embodiments, as shown in FIG. 2 and FIG. 3, the plurality of first light-emitting units 100 may be arranged in an array on a growth substrate 110. For convenience of illustration, an array with merely 5*5 units of first light-emitting units 100 is shown, but the number of the first light-emitting units 100 on the growth substrate 110 is not limited herein, or the structures shown in FIG. 2 and FIG. 3 may be regarded as partial schematic diagrams of the growth substrate 110. The growth substrate 110 may be, for example, a wafer or an epitaxial substrate, but not limited herein. According to some embodiments, the first light-emitting units 100 may be directly formed or fabricated on the surface of the growth substrate 110, but not limited herein. As shown in FIG. 3, each of the first light-emitting units 100 may include a first semiconductor layer (such as, but not limited to, an N-type semiconductor layer) 120, a light-emitting layer 130, a second semiconductor layer (such as, but not limited to, a P-type semiconductor layer) 140, a first electrode 150 and a second electrode 160. The first semiconductor layer 120 is disposed on the surface of the growth substrate 110, the light-emitting layer 130 and the first electrode 150 are disposed on the first semiconductor layer 120, the second semiconductor layer 140 is disposed on the light-emitting layer 130, and the second electrode 160 is disposed on the second semiconductor layer 140. According to some embodiments, the first semiconductor layer 120 may be a P-type semiconductor, and the second semiconductor layer 140 may be an N-type semiconductor layer. In addition, the plurality of second light-emitting units 200 may be arranged in an array on a growth substrate 210. Similar to the structure of the first light-emitting unit 100 shown in FIG. 3, each of the second light-emitting units 200 may include a first semiconductor layer (such as, but not limited to, an N-type semiconductor layer) 220, a light-emitting layer 230, a second semiconductor layer (such as, but not limited to, a P-type semiconductor layer) 240, a first electrode 250, and a second electrode 260 (as shown in FIG. 8), but the light-emitting layer 230 of the second light-emitting unit 200 and the light-emitting layer 130 of the first light-emitting unit 100 are configured to emit light with different colors.

In some embodiments, the first light-emitting units 100 and/or the second light-emitting units 200 may include, for example, light emitting diodes (LEDs), mini light-emitting diodes (mini LEDs), micro light-emitting diodes (micro LEDs), quantum dot light-emitting diodes (quantum dot LEDs) or organic light emitting diodes (OLEDs), but not limited herein, and the first light-emitting units 100 and/or the second light-emitting units 200 may further have other structures or include other types of light-emitting elements.

Referring to FIG. 1, the step S200 may be performed after the step S100. As shown in the step S200, the optical character of each of the first light-emitting units 100 and the second light-emitting units 200 is obtained. The optical character may be, for example, a peak wavelength value, a luminance value, a combination of a peak wavelength value and a luminance value or a color coordinate value, but not limited herein. In some embodiments, the optical character of each of the first light-emitting units 100 and the second light-emitting units 200 may be obtained by performing a test on each of the first light-emitting units 100 and the second light-emitting units 200. In some embodiments, the test described above may be performed by an electroluminescence testing procedure. Specifically, a current may be provided to the first light-emitting unit 100 or the second light-emitting unit 200 that is to be tested, so that the first light-emitting unit 100 or the second light-emitting unit 200 may emit light. The light is analyzed after being collected by a detector, so as to obtain the optical character of each of the first light-emitting units 100 and the second light-emitting units 200, but not limited herein. In some embodiments, the test described above may be performed by a photoluminescence testing procedure. Specifically, light with a specific wavelength may be provided to the first light-emitting unit 100 or the second light-emitting unit 200, so that the first light-emitting unit 100 or the second light-emitting unit 200 may emit light after being excited. The light is analyzed after being collected by a detector, so as to obtain the optical character of each of the first light-emitting units 100 and the second light-emitting units 200, but not limited herein.

In some embodiments of the present disclosure, the first light-emitting units 100 and the second light-emitting units 200 may be further respectively divided into a plurality of groups based on the obtained optical character of each of the first light-emitting units 100 and the second light-emitting units 200. As shown in FIG. 2, in some embodiments, the plurality of first light-emitting units 100 may be divided into a first group B1 (indicated by a shading pattern of upper-right to lower-left oblique lines with the lowest density), a second group B2 (indicated by a shading pattern of upper-right to lower-left oblique lines with the intermediate density) and a third group B3 (indicated by a shading pattern of upper-right to lower-left oblique lines with the highest density). The first light-emitting units 100 of the first group B1, the second group B2 and the third group B3 respectively correspond to optical characters of different numerical ranges. That is to say, the first light-emitting units 100 in the same group correspond to the optical characters of the same numerical range. Furthermore, the plurality of second light-emitting units 200 may be divided into a fourth group G1 (indicated by a shading of upper left-lower right oblique lines with the lowest density), a fifth group G2 (indicated by a shading of upper left-lower right oblique lines with the intermediate density) and a sixth group G3 (indicated by a shading of upper left-lower right oblique lines with the highest density). The second light-emitting units 200 of the fourth group G1, the fifth group G2 and the sixth group G3 respectively correspond to optical characters of different numerical ranges. That is to say, the second light-emitting units 200 in the same group correspond to the optical characters of the same numerical range. However, the number of groups that are divided is not limited to the above, and the first light-emitting units 100 and the second light-emitting units 200 may be respectively divided into plural groups according to practical requirements.

On the other hand, referring to FIG. 1, a step S300 may be performed. As shown in the step S300, a target color point for the display device DE is predetermined. For example, the target color point may correspond to a color coordinate value (or a range of the color coordinate value) or a color temperature (or a range of the color temperature) in a color coordinate diagram, but not limited herein. In some embodiments, the target color point may be a color point corresponding to the mixture of blue light and green light, or a color point corresponding to the mixture of blue light, green light and red light (i.e., a white point), but not limited herein. In the method for manufacturing the display device DE of the present disclosure, the step S300 may be performed at any time before the step S400. For example, the step S300 may be performed before the step S100, or the step S300 may be performed after the step S100 and before the step S400.

The step S400 may be performed after the optical character of each of the first light-emitting units 100 and the second light-emitting units 200 is obtained (as shown in the step S200) and the target color point for the display device DE is predetermined (as shown in the step S300). As shown in the step S400 of FIG. 1 and FIG. 4, a portion of the first light-emitting units 100 and a portion of the second light-emitting units 200 are transferred to a target substrate SB based on the obtained optical characters for aligning a color point of the display device DE with the target color point. The target substrate SB may be a substrate applied to the display device DE, such as a substrate used for disposing light-emitting elements and/or a circuit layer in a display panel, but not limited herein. In some embodiments, the target substrate SB may include a base layer and a circuit layer, and the circuit layer is disposed on the base layer. The base layer may include rigid materials and/or flexible materials. For example, the base layer may include glass, a quartz substrate, polyimide (PI), polycarbonate (PC), polyethylene terephthalate (PET), other suitable materials or combinations of the above, but not limited herein. The circuit layer may include, for example, circuits, wires, electronic elements and/or bonding pads, but not limited herein.

As shown in FIG. 4, after the first light-emitting units 100 and the second light-emitting units 200 are divided into a plurality of groups based on the obtained optical character of each of the first light-emitting units 100 and the second light-emitting units 200, a portion of the first light-emitting units 100 (e.g., the first light-emitting units 100 of the first group B1) and a portion of the second light-emitting units 200 (e.g., the second light-emitting units 200 of the fourth group G1) may be transferred to a target substrate SB1 of a display device DE1 for aligning a color point of the display device DE1 with the target color point predetermined in the step S300. In addition, the first light-emitting units 100 of the second group B2 and the second light-emitting units 200 of the fifth group G2 may be transferred to a target substrate SB2 of another display device DE2, and the first light-emitting units 100 of the third group B3 and the second light-emitting units 200 of the sixth group G3 may be transferred to a target substrate SB3 of another display device DE3, so that the color point of the display device DE1, the color point of the display device DE2 and the color point of the display device DE3 are all aligned with the predetermined target color point.

In the present disclosure, "a color point of a display device being aligned with a target color point" means that the color point of the light generated by the display device DE is the same as or similar to the target color point. For example, when a color coordinate value of the target color point is (X, Y), the color coordinate value of the color point of the manufactured display device DE may be in the range of (X±0.01, Y±0.01) or the range of (X±0.02, Y±0.02). Therefore, by matching the first light-emitting units 100 and the second light-emitting units 200 emitting light with different colors and their optical characters (for example, matching suitable groups of light emitting-units), the color point of the display device DE1, the color point of the display device DE2 and the color point of the display device DE3 that are manufactured may all be the same as or similar to the predetermined target color point, that is, the difference or deviation between the color points of manufactured display devices DE is small. A color coordinate values (Wx, Wy) of a color point of mixing light with different colors may be calculated, for example, by a relation: (Wx, Wy)=a (Rx, Ry)+b(Bx, By)+c(Gx, Gy), wherein (Rx, Ry), (Bx, By) and (Gx, Gy) are respectively color coordinate values corresponding to red light, blue light and green light with specific wavelengths, and a, b and c are respectively luminance ratios corresponding to red light, blue light and green light.

In some embodiments, as shown in FIG. 4, after a portion of the first light-emitting units 100 and a portion of the second light-emitting units 200 are transferred to a target substrate SB, if the first light-emitting units 100 are configured to emit blue light and the second light-emitting units 200 are configured to emit green light, wavelength conversion elements may further be disposed on part of the first light-emitting units 100 to convert the blue light into red light. Therefore, even if no red light-emitting unit is disposed on the target substrate SB, by disposing the first light-emitting units 100 emitting blue light and the second-light emitting units 200 emitting green light and matching the wavelength conversion elements, the target substrate SB that the first light-emitting units 100 and the second-light emitting units 200 are disposed on may finally emit three or more colors of light. On the other hand, the selected first light-emitting units 100 and second light-emitting units 200 may be light-emitting units with better luminous efficiency and matched with wavelength conversion elements to finally generate plural colors of light, without disposing red light-emitting units with relatively low luminous efficiency, so that the overall luminous efficiency of the target substrate SB may be improved, or the luminous efficiency of all light-emitting units may be balanced. The wavelength conversion elements described above may include, for example, color filters, quantum dot material, fluorescent material or phosphorescent material, but not limited herein.

In some embodiments, the obtained optical character of each of the first light-emitting units 100 and the second light-emitting units 200 may be a peak wavelength value. The peak wavelength value may be measured by any suitable spectrometer, for example. The first light-emitting units 100 and the second light-emitting units 200 may be respectively divided into a plurality of groups based on the peak wavelength value of each of the first light-emitting units 100 and the second light-emitting units 200. For example, based on the peak wavelength of blue light for the color standard of Rec. 2020 is 457 nanometers (nm), the plurality of first light-emitting units 100 may be divided into a first group B1 with a band of shorter peak wavelength (e.g., the peak wavelength value is 454-455.9 nm), a second group B2 with a band of intermediate peak wavelength (e.g., the peak wavelength value is 456-457.9 nm) and a third group B3 with a band of longer peak wavelength (e.g., the peak wavelength value is 458-460.9 nm). Furthermore, based on the peak wavelength of green light for the color standard of Rec. 2020 is 522 nm, the plurality of second light-emitting units 200 may be divided into a fourth group G1 with a band of shorter peak wavelength (e.g., the peak wavelength value is 520-520.9 nm), a fifth group G2 with a band of intermediate peak wavelength (e.g., the peak wavelength value is 521-522.9 nm) and a sixth group G3 with a band of longer peak wavelength (e.g., the peak wavelength value is 523-524.9 nm). The numerical ranges of the peak wavelength values corresponding to the above groups are merely one of the examples, but not limited herein. For example, the groups may be divided based on other color standards (e.g., the color standard of DCI-P3) or suitable numerical ranges in the present disclosure.

Figure 5:
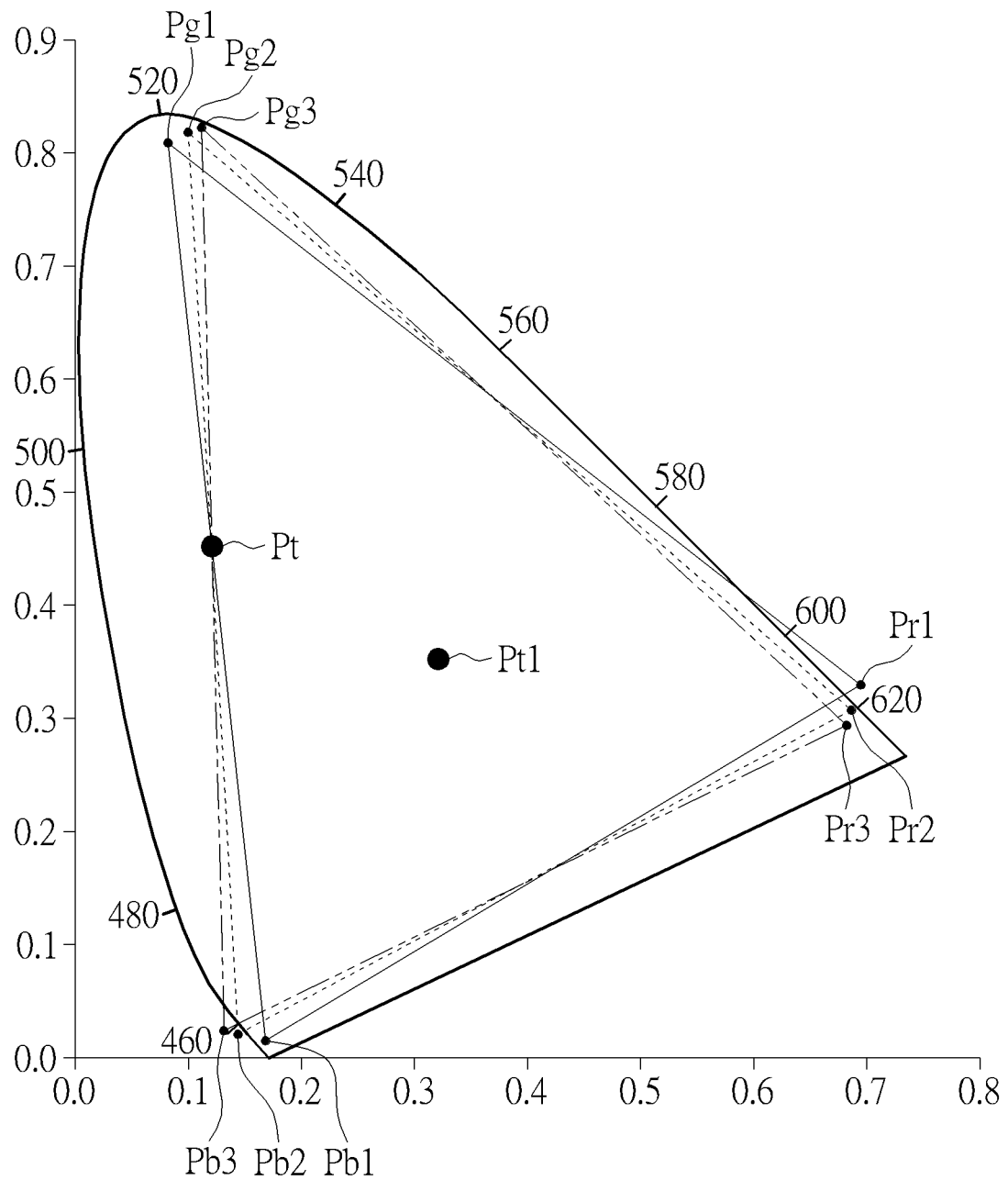
FIG. 5 is a color coordinate diagram according to an embodiment of the present disclosure.

Moreover, please refer to FIG. 5, which is a color coordinate diagram according to an embodiment of the present disclosure. As shown in FIG. 4 and FIG. 5, in some embodiments, the first light-emitting units 100 of the first group B1 may substantially correspond to a color point Pb1, the first light-emitting units 100 of the second group B2 may substantially correspond to a color point Pb2, and the first light-emitting units 100 of the third group B3 may substantially correspond to a color point Pb3. Furthermore, the second light-emitting units 200 of the fourth group G1 may correspond to a color point Pg1, the second light-emitting units 200 of the fifth group G2 may correspond to a color point Pg2, and the second light-emitting units 200 of the sixth group G3 may correspond to a color point Pg3. Therefore, as shown in the step S400, FIG. 4 and FIG. 5, the first group B1 with the band of shorter peak wavelength corresponding to color point Pb1 is matched with the fourth group G1 with the band of shorter peak wavelength corresponding to the color point Pg1, the second group B2 with the band of intermediate peak wavelength corresponding to the color point Pb2 is matched with the fifth group G2 with the band of intermediate peak wavelength corresponding to the color point Pg2, and the third group B3 with the band of longer peak wavelength corresponding to the color point Pb3 is matched with the sixth group G3 with the band of longer peak wavelength corresponding to the color point Pg3. Therefore, the color point of the display device DE1, the color point of the display device DE2 and the color point of the display device DE3 that are manufactured are all aligned with a target color point Pt.

In some embodiments, in the step S400, one of the transferred portion of the first light-emitting units 100 may have a first peak wavelength, another one of the transferred portion of the first light-emitting units 100 may have a second peak wavelength, and a difference between the first peak wavelength and the second peak wavelength may be less than 2 nm, but not limited herein. That is to say, according an embodiment, the difference between the peak wavelengths of different light-emitting units in the same group may be less than 2 nm. Specifically, for example, one of the first light-emitting units 100 in the first group B1 may have a first peak wavelength, another one of the first light-emitting units 100 in the first group B1 may have a second peak wavelength, and the difference between the first peak wavelength and the second peak wavelength may be less than 2 nm. Similarly, the difference between the peak wavelength of one of the transferred portion of the second light-emitting units 200 and the peak wavelength of another one of the transferred portion of the second light-emitting units 200 may be less than 2 nm, but not limited herein. Specifically, for example, one of the second light-emitting units 200 in the fourth group G1 may have a first peak wavelength, another one of the second light-emitting units 200 in the fourth group G1 may have a second peak wavelength, and the difference between the first peak wavelength and the second peak wavelength may be less than 2 nm. In other words, according to the present disclosure, the optical characters of the light-emitting units in the same group are similar to each other. For example, the difference between the peak wavelengths of the light-emitting units in the same group may be less than 2 nm when the optical characters are peak wavelengths, but the present disclosure is not limited to the above.

In some embodiments, the optical character may be a luminance value. For example, the same energy may be applied to each of the first light-emitting units 100 and the second light-emitting units 200 by electroluminescence or photoluminescence, and the luminance value thereof may be obtained by measurement. The first light-emitting units 100 and the second light-emitting units 200 may be respectively divided into a plurality of groups based on the luminance value of each of the first light-emitting units 100 and the second light-emitting units 200. For example, an average luminance L1 of the plurality of first light-emitting units 100 as a whole may be measured, and the luminance of each of the first light-emitting units 100 may be respectively measured. Then, after the luminance of each of the first light-emitting units 100 is compared with the average luminance L1, the first light-emitting units 100 may be divided into a first group B1 with lower luminance (e.g., the luminance value is 0.7-0.9 times of the average luminance L1), a second group B2 with intermediate luminance (e.g., the luminance value is 0.9-1.1 times of the average luminance L1) and a third group B3 with higher luminance (e.g., the luminance value is 1.1-1.3 times of the average luminance L1). Similarly, an average luminance L2 of the plurality of second light-emitting units 200 as a whole may be measured, and then the luminance of each of the second light-emitting units 200 may be respectively measured. After comparing the luminance of each of the second light-emitting units 200 with the average luminance L2, the second light-emitting units 200 may be divided into a fourth group G1 with lower luminance (e.g., the luminance value is 0.7-0.9 times of the average luminance L2), a fifth group G2 with intermediate luminance (e.g., the luminance value is 0.9-1.1 times of the average luminance L2) and a sixth group G3 with higher luminance (e.g., the luminance value is 1.1-1.3 times of the average luminance L2), but not limited herein.

According to some embodiments, as shown in the step S400 and FIG. 4, the first group B1 with lower luminance and the fourth group G1 with lower luminance may be transferred to the same target substrate SB1, the second group B2 with intermediate luminance and the fifth group G2 with intermediate luminance may be transferred to the same target substrate SB2, and the third group B3 with higher luminance and the sixth group G3 with higher luminance may be transferred to the same target substrate SB3. Thus, the color point of the manufactured display device DE1 including the target substrate SB1 may be aligned with the target color point, the color point of the manufactured display device DE2 including the target substrate SB2 may be aligned with the target color point, and the color point of the manufactured display device DE3 including the target substrate SB3 may be aligned with the target color point. Furthermore, the difference of luminance in one target substrate SB may be reduced, so as to facilitate the subsequent adjustment or compensation of luminance, thereby improving the uniformity of the color of the display image. In some embodiments, the average luminance of the whole light-emitting units in one or plural growth substrate(s) may be measured, and the luminance of each of the light-emitting units may be respectively measured. Then, the luminance of each of the light-emitting units may be compared with the average luminance, and the light-emitting units may be divided into groups, but not limited herein.

In some embodiments, the optical character may be a combination of a peak wavelength value and a luminance value. The first light-emitting units 100 and the second light-emitting units 200 may be respectively divided into a plurality of groups based on the peak wavelength value and luminance value of each of the first light-emitting units 100 and the second light-emitting units 200. That is to say, the first light-emitting units 100 in the same band of peak wavelength and the same range of luminance are divided into a group, and the second light-emitting units 200 in the same band of peak wavelength and the same range of luminance are divided into a group. For example, the plurality of first light-emitting units 100 may be divided into a group with the peak wavelength value of 454-455.9 nm and the luminance value of 0.7-0.9 times of average luminance L1, a group with the peak wavelength value of 454-455.9 nm and the luminance value of 0.9-1.1 times of average luminance L1, a group with the peak wavelength value of 454-455.9 nm and the luminance value of 1.1-1.3 times of average luminance L1, a group with the peak wavelength value of 456-457.9 nm and the luminance value of 0.7-0.9 times of average luminance L1, a group with the peak wavelength value of 456-457.9 nm and the luminance value of 0.9-1.1 times of average luminance L1, a group with the peak wavelength value of 456-457.9 nm and the luminance value of 1.1-1.3 times of average luminance L1, a group with the peak wavelength value of 458-460.9 nm and the luminance value of 0.7-0.9 times of average luminance L1, a group with the peak wavelength value of 458-460.9 nm and the luminance value of 0.9-1.1 times of average luminance L1, and a group with the peak wavelength value of 458-460.9 nm and the luminance value of 1.1-1.3 times of average luminance L1, but not limited herein. The second light-emitting units 200 may further be divided into a plurality of groups through the similar method. Accordingly, the first light-emitting units 100 of one of the groups and the second light-emitting units 200 of one of the groups may be transferred to the target substrate SB for aligning the color point of the display device DE with the target color point.

In some embodiments, the optical character may be a color coordinate value. Based on the peak wavelength value and the luminance value of each of the first light-emitting units 100 and the second light-emitting units 200, the color coordinate value respectively corresponding to the light emitted by each of the first light-emitting units 100 and the second light-emitting units 200 may be obtained by calculation. Alternatively, the color coordinate value of each of the first light-emitting units 100 and the second light-emitting units 200 may be obtained by measuring with a colorimeter. The first light-emitting units 100 and the second light-emitting units 200 may be respectively divided into a plurality of groups based on the color coordinate value of each of the first light-emitting units 100 and the second light-emitting units 200. Accordingly, the first light-emitting units 100 of one of the groups and the second light-emitting units 200 of one of the groups may be transferred to the target substrate SB for aligning the color point of the display device DE with the target color point.

Figure 6:
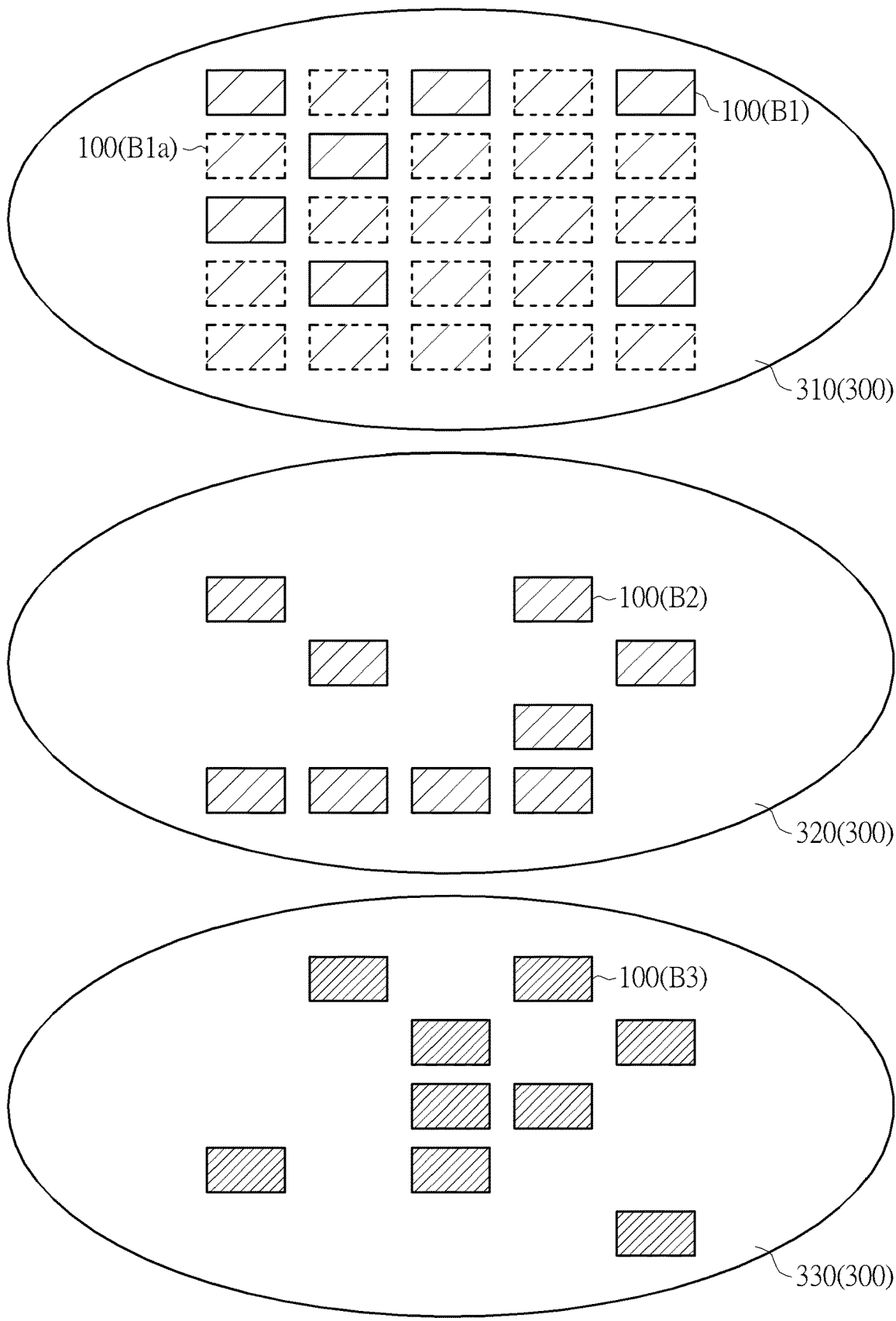
FIG. 6 to FIG. 8 are schematic diagrams illustrating a part of the process of a method for manufacturing a display device according the present disclosure.
Figure 7:
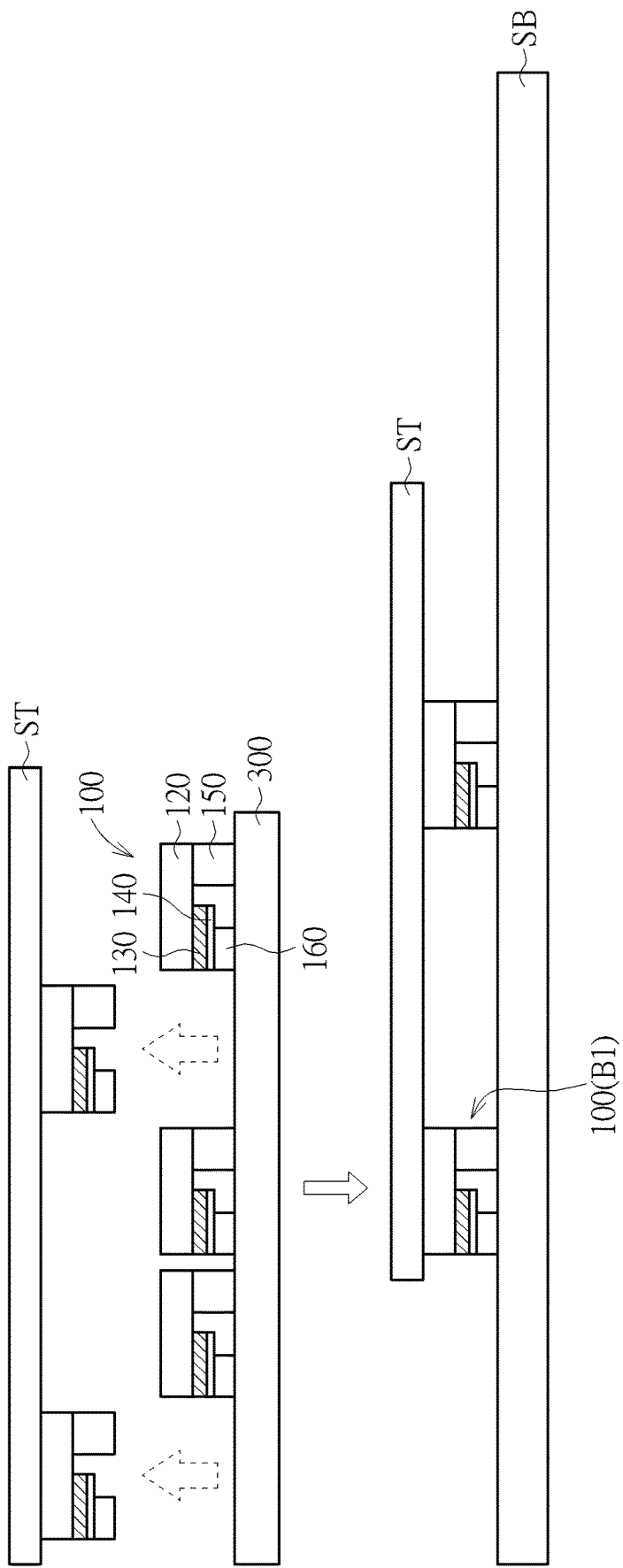

Please refer to FIG. 6 to FIG. 8. FIG. 6 to FIG. 8 are schematic diagrams illustrating a part of the process of a method for manufacturing a display device according to the present disclosure. In some embodiments, the transferring step S400 may further include the following steps. As shown in FIG. 6, different portions of the first light-emitting units 100 (e.g., the first light-emitting units 100 of the first group B1, the second group B2 or the third group B3) may be transferred to different first carriers 300 respectively. For example, the first-light emitting units 100 of the first group B1 may be transferred from the growth substrate 110 to the first carrier 310, the first light-emitting units 100 of the second group B2 may be transferred from the growth substrate 110 to the first carrier 320, and the first light-emitting units 100 of the third group B3 may be transferred from the growth substrate 110 to the first carrier 330, respectively, such that a single first carrier 300 has the first light-emitting units 100 of the same group thereon. Similarly, different portions of the second light-emitting units 200 (e.g., the second light-emitting units 200 of the fourth group G1, the fifth group G2 or the sixth group G3) may be transferred to different second carriers 400 respectively (as shown in FIG. 8). For example, the second light-emitting units 200 of different groups may be respectively transferred from the growth substrate 210 to different second carriers 400 correspondingly according to a method similar to the method shown in FIG. 6, such that a single second carrier 400 has the second light-emitting units 200 of the same group thereon. For example, the second light-emitting units 200 of the fourth group G1 may be transferred from the growth substrate 210 to the second carrier 400.

In some embodiments, after a portion of the first light-emitting units 100 on one growth substrate 110 (e.g., the first light-emitting units 100 of one of the groups) is transferred to the first carrier 300, a portion of the first light-emitting units 100 on another growth substrate or other growth substrates corresponding to the same group may be supplemented to the first carrier 300. In detail, as shown in FIG. 6, the first light-emitting units 100(B1) belonging to the first group B1 on one growth substrate may be transferred to the first carrier 310, and the first light-emitting units 100(B1a) belonging to the first group B1 on another growth substrate (shown with the dotted line frame) may be transferred to the same first carrier 310. Thus, there are first light-emitting units 100 of the same group B1 transferred from different growth substrates on the first carrier 310, and the first light-emitting units 100 arranged in an array may be formed. That is to say, the first light-emitting units 100 transferred to the first carrier 310 may be transferred from at least two growth substrates 110, but not limited herein. The above-mentioned "corresponding to the same group" refers to the light-emitting units with the optical characters of the same numerical range when the light-emitting units are divided into groups according to the above method of the present disclosure. As shown in FIG. 6, the first light-emitting units 100(B1) and the first light-emitting units 100(B1a) transferred to the first carrier 310 belong to the same group B1.

Then, referring to FIG. 7 and together with FIG. 6 and FIG. 4, the portions of the first light-emitting units 100 may be transferred from the first carrier(s) 300 to the target substrate(s) SB. For example, the first-light emitting units 100 of the first group B1 may be transferred from the first carrier 310 to the target substrate SB1, the first light-emitting units 100 of the second group B2 may be transferred from the first carrier 320 to the target substrate SB2, and the first light-emitting units 100 of the third group B3 may be transferred from the first carrier 330 to the target substrate SB3, respectively. In some embodiments, as shown in FIG. 7, for example, the first light-emitting units 100 of the first group B1 on the first carrier 300 may be picked by a transfer element ST and then placed on the target substrate SB, but not limited herein. Furthermore, as shown in FIG. 8, the portions of the second light-emitting units 200 may be transferred from the second carrier(s) 400 to the target substrate(s) SB. For example, the second light-emitting units 200 of the fourth group G1 on the second carrier 400 may be picked by a transfer element ST and then placed on the target substrate SB, but not limited herein.

In some embodiments, the damaged first light-emitting units 100 may further be excluded. For example, the damaged first light-emitting units 100 may be removed from the growth substrate 110 at first, and then the undamaged first light-emitting units 100 may be transferred, but not limited herein. In some embodiments, when a portion of the first light-emitting units 100 (e.g., the first light-emitting units 100 of the first group B1, the second group B2 or the third group B3) is transferred from the growth substrate 110 to the first carrier 300, merely the good (undamaged) first light-emitting units 100 may be transferred, and the damaged first light-emitting units 100 are not transferred, but not limited herein. In some embodiments, the damaged first light-emitting units 100 may be removed on the first carrier 300 after a portion of the first light-emitting units 100 is transferred from the growth substrate 110 to the first carrier 300, but not limited herein. Similarly, the damaged second light-emitting units 200 may further be excluded. For example, the damaged second light-emitting units 200 may be excluded by any of the methods described above, but not limited herein.

Figure 9:
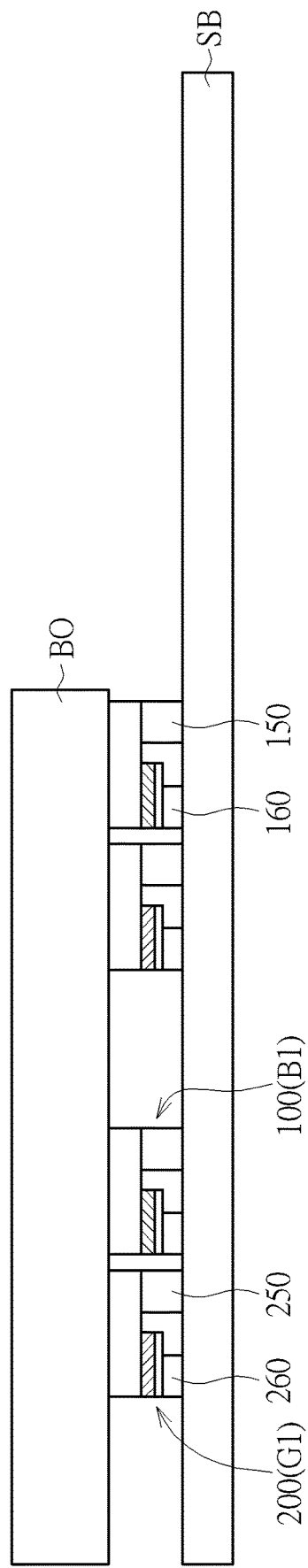
FIG. 9 is a schematic diagram illustrating a part of the process of a method for manufacturing a display device according the present disclosure.

Please refer to FIG. 9. FIG. 9 is a schematic diagram illustrating a part of the process of a method for manufacturing a display device according the present disclosure. As shown in FIG. 9, in some embodiments, after a portion of the first light-emitting units 100 (e.g., the first light-emitting units 100 of the first group B1, the second group B2 or the third group B3) and/or a portion of the second light-emitting units 200 (e.g., the second light-emitting units 200 of the fourth group G1, the fifth group G2 or the sixth group G3) are transferred to the target substrate SB (as shown in FIG. 8), the portion of the first light-emitting units 100 and/or the portion of the second light-emitting units 200 may further be electrically connected to the target substrate SB by a first bonding process. For example, the first bonding process may be performed through a bonding element BO to achieve the electrical connection of the elements. The bonding element BO may be, for example, a stamp, and the first bonding process may include, for example, heating and pressing steps, but not limited herein.

For example, the target substrate SB may include a circuit layer (not shown). The circuit layer may include, for example, circuits, wires, electronic elements and/or bonding pads, but not limited herein. The circuit layer in the target substrate SB may include driving elements. The driving element may be a thin film transistor and electrically connected to the light-emitting unit. The first bonding process may be performed through the bonding element BO after the first light-emitting units 100 and/or the second light-emitting units 200 are transferred to the target substrate SB, so as to make the first electrode 150 and the second electrode 160 of each of the first light-emitting units 100 and/or the first electrode 250 and the second electrode 260 of each of the second light-emitting units 200 electrically connect to the circuits or the electronic elements in the circuit layer of the target substrate SB, respectively. For example, bonding pads, bumps, solder or other conductive materials may be used to electrically connect the electrodes of the first light-emitting units 100 and the second light-emitting units 200 to the thin film transistors in the circuit layer, but not limited herein.

In some embodiments, the target substrate SB may include a conductive layer (not shown), and the first light-emitting units 100 and/or the second light-emitting units 200 may be electrically connected to the circuit layer of the target substrate SB through the conductive layer. The conductive layer may be, for example, an anisotropic conductive film (ACF), but not limited herein. In detail, when a portion of the first light-emitting units 100 and/or a portion of the second light-emitting units 200 are transferred to the target substrate SB, the conductive layer may be disposed on the target substrate SB at first, and then the first light-emitting units 100 and/or the second light-emitting units 200 may be placed on the conductive layer. The conductive layer may be adhesive to temporarily fix the first light-emitting units 100 and/or the second light-emitting units 200, but the first light-emitting units 100 and/or the second light-emitting units 200 are not electrically connected to the target substrate SB at this time. Then, during the first bonding process performed through the bonding element BO, the conductive layer may be hardened with the increase of time and temperature, and meanwhile the conductive material in the conductive layer after being pressed may make the first electrode 150 and the second electrode 160 of the first light-emitting unit 100 and/or the first electrode 250 and the second electrode 260 of the second light-emitting unit 200 electrically connect to the target substrate SB (e.g., electrically connect to the circuit layer on the surface of the target substrate SB) through the conductive layer. In addition, the condition of electrical connection may further be tested during the first bonding process. If any abnormality is found, it may be directly repaired. For example, the light-emitting unit with abnormal electrical connection may be removed or replaced, or a light-emitting unit may be additionally disposed adjacent to the light-emitting unit with abnormal electrical connection, but not limited herein.

Figure 10:
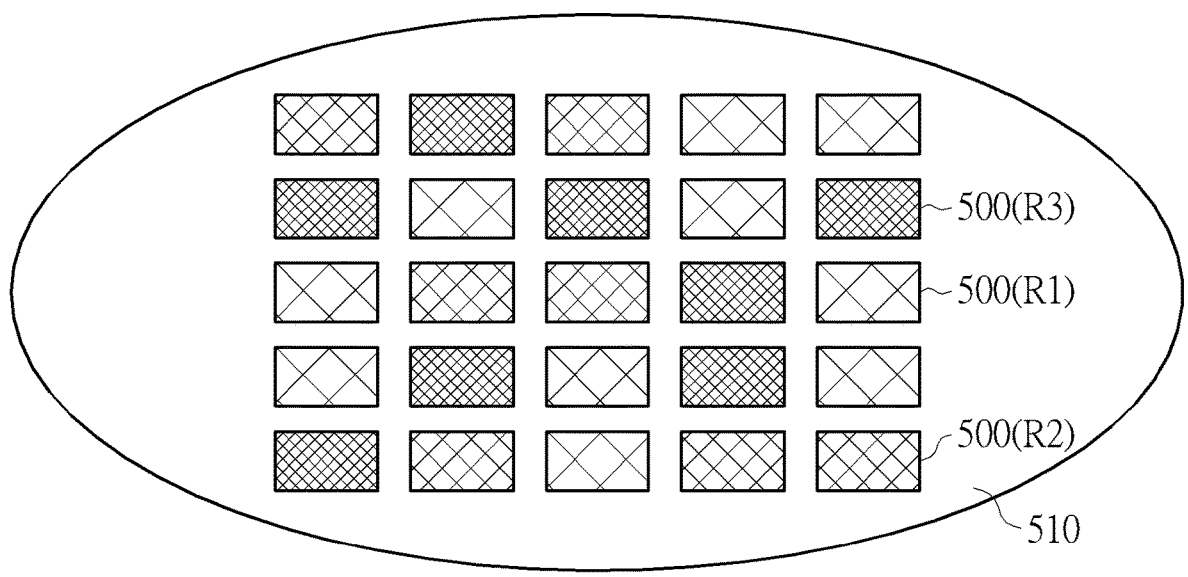
FIG. 10 is a top-view schematic diagram of third light-emitting units on a growth substrate according to an embodiment of the present disclosure.
Figure 11:
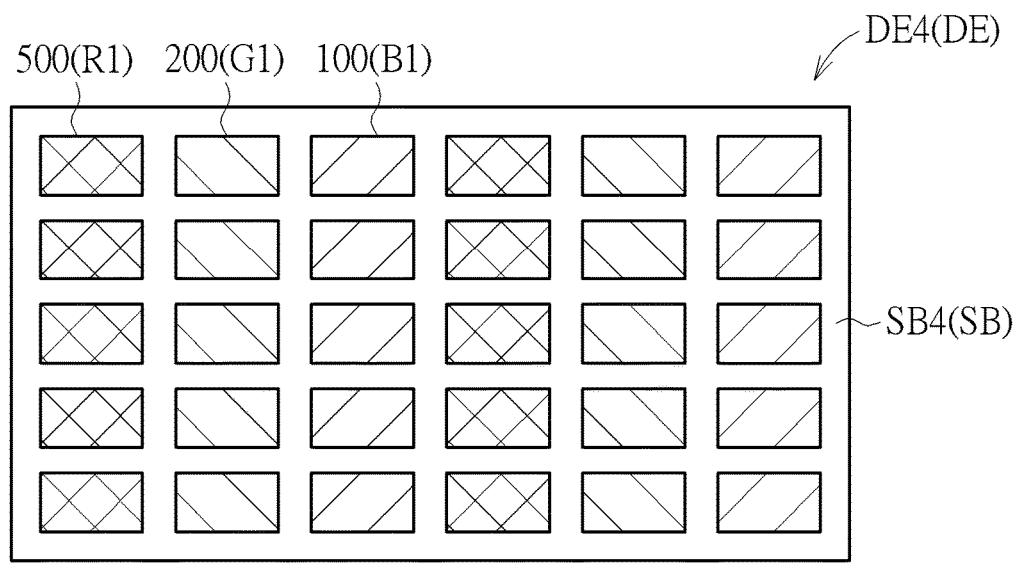
FIG. 11 is a top-view schematic diagram of a display device according to an embodiment of the present disclosure.
Figure 12:
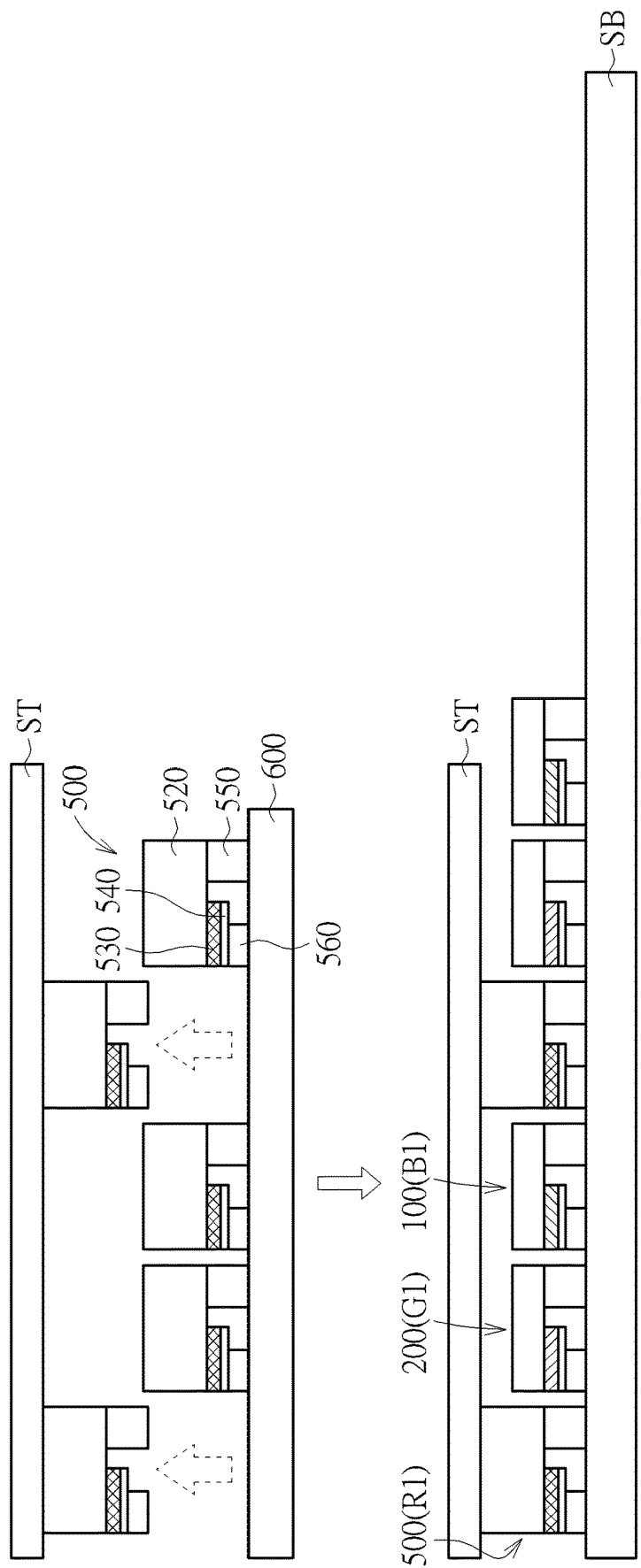
FIG. 12 to FIG. 13 are schematic diagrams illustrating another part of the process of a method for manufacturing a display device according the present disclosure.

The process of manufacturing a display device including light-emitting units of three different colors is described in the following. Please refer to FIG. 10 and FIG. 11, cooperated with FIG. 1 to FIG. 3 and FIG. 5. FIG. 10 is a top-view schematic diagram of third light-emitting units on a growth substrate according to an embodiment of the present disclosure. FIG. 11 is a top-view schematic diagram of a display device according to an embodiment of the present disclosure. As shown in FIG. 10, in some embodiments, the method for manufacturing the display device DE may further include steps as follows. A plurality of third light-emitting units 500 are provided, and the first light-emitting units 100, the second light-emitting units 200 and the third light-emitting units 500 are configured to emit light with different colors. For example, the first light-emitting units 100 may be configured to emit blue light, the second light-emitting units 200 may be configured to emit green light, and the third light-emitting units 500 may be configured to emit red light, but not limited herein. The plurality of third light-emitting units 500 may be arranged in an array on a growth substrate 510. The growth substrate 510 may be, for example, a wafer or an epitaxial substrate, but not limited herein. As shown in FIG. 12, each of the third light-emitting units 500 may include a first semiconductor layer (such as an N-type semiconductor layer) 520, a light-emitting layer 530, a second semiconductor layer (such as a P-type semiconductor layer) 540, a first electrode 550 and a second electrode 560 (as shown in FIG. 12). The third light-emitting units 500 may include, for example, light emitting diodes (LED), mini light-emitting diodes (mini LEDs), micro light-emitting diodes (micro LEDs), quantum dot light-emitting diodes (quantum dot LEDs) or organic light emitting diodes (OLEDs), but not limited herein, and the third light-emitting units 500 may further have other structures or include other types of light-emitting elements.

Then, an optical character of each of the third light-emitting units 500 may be obtained after the step of providing a plurality of third light-emitting units 500. The obtained optical character may be, for example, a peak wavelength value, a luminance value, a combination of a peak wavelength value and a luminance value or a color coordinate value. In addition, the optical character of each of the third light-emitting units 500 may be obtained by performing a test on each of the third light-emitting units 500. This test may be the test performed on the first light-emitting units 100 and the second light-emitting units 200 as described above, and will not be described redundantly herein.

Then, as shown in FIG. 11, a portion of the third light-emitting units 500 may be transferred to the target substrate SB based on the obtained optical characters after the step of obtaining the optical character of each of the third light-emitting units 500. In some embodiments, a portion of the first light-emitting units 100, a portion of the second light-emitting units 200 and a portion of the third light-emitting units 500 may be transferred to the target substrate SB for aligning the color point of the display device DE with the target color point. The target color point may be a target white point, such as the white point D65 (the color coordinate value thereof is (0.3127, 0.3290)). The color coordinate value of the color point of the manufactured display device may be (0.3127±0.01, 0.3290±0.01) or (0.3127±0.02, 0.3290±0.02), for example, but not limited herein. In detail, the third light-emitting units 500 may be divided into a plurality of groups based on the obtained optical character of each of the third light-emitting units 500. As shown in FIG. 10, in some embodiments, the plurality of third light-emitting units 500 may be divided into a seventh group R1 (indicated by a shading pattern of cross oblique lines with the lowest density), an eighth group R2 (indicated by a shading pattern of cross oblique lines with the intermediate density) and a ninth group R3 (indicated by a shading pattern of cross oblique lines with the highest density). The third light-emitting units 500 of the seventh group R1, the eighth group R2 and the ninth group R3 respectively correspond to optical characters of different numerical ranges. The third light-emitting units 500 in the same group correspond to the optical characters of the same numerical range. However, the number of groups that are divided is not limited to the above, and the third light-emitting units 500 may be divided into plural groups according to practical requirements.

As shown in FIG. 11, after the first light-emitting units 100, the second light-emitting units 200 and the third light-emitting units 500 are divided into a plurality of groups based on the obtained optical character of each of the first light-emitting units 100, the second light-emitting units 200 and the third light-emitting units 500, a portion of the first light-emitting units 100 (e.g., the first light-emitting units 100 of the first group B1), a portion of the second light-emitting units 200 (e.g., the second light-emitting units 200 of the fourth group G1) and a portion of the third light-emitting units 500 (e.g., the third light-emitting units 500 of the seventh group R1) may be transferred to a target substrate SB4 of a display device DE4 for aligning a color point of the display device DE4 with the target white point. In addition, the first light-emitting units 100 of the second group B2, the second light-emitting units 200 of the fifth group G2 and the third light-emitting units 500 of the eighth group R2 may be transferred to a target substrate of another display device (not shown). The first light-emitting units 100 of the third group B3, the second light-emitting units 200 of the sixth group G3 and the third light-emitting units 500 of the ninth group R3 may be transferred to a target substrate of another display device (not shown). Therefore, the color points of the manufactured display devices DE are all aligned with the target color point.

In some embodiments, the obtained optical character of each of the third light-emitting units 500 may be a peak wavelength value. The third light-emitting units 500 may be divided into a plurality of groups based on the peak wavelength value of each of the third light-emitting units 500. For example, based on the peak wavelength of red light for the color standard of Rec. 2020 is 620 nm, the plurality of third light-emitting units 500 may be divided into a seventh group R1 with a band of shorter peak wavelength (e.g., the peak wavelength value is 617-618.9 nm), an eight group R2 with a band of intermediate peak wavelength (e.g., the peak wavelength value is 619-620.9 nm) and a ninth group R3 with a band of longer peak wavelength (e.g., the peak wavelength value is 621-622.9 nm). Furthermore, as shown in FIG. 5, the third light-emitting units 500 of the seventh group R1 may substantially correspond to a color point Pr1, the third light-emitting units 500 of the eighth group R2 may substantially correspond to a color point Pr2, and the third light-emitting units 500 of the ninth group R3 may substantially correspond to a color point Pr3. According to some embodiments, the first group B1 with the band of shorter peak wavelength corresponding to color point Pb1 is matched with the fourth group G1 with the band of shorter peak wavelength corresponding to the color point Pg1 and the seventh group R1 with the band of shorter peak wavelength corresponding to the color point Pr1 (such as the display device DE4 shown in FIG. 11), the second group B2 with the band of intermediate peak wavelength corresponding to the color point Pb2 is matched with the fifth group G2 with the band of intermediate peak wavelength corresponding to the color point Pg2 and the eighth group R2 with the band of intermediate peak wavelength corresponding to the color point Pr2, and the third group B3 with the band of longer peak wavelength corresponding to the color point Pb3 is matched with the sixth group G3 with the band of longer peak wavelength corresponding to the color point Pg3 and the ninth group R3 with the band of longer peak wavelength corresponding to the color point Pr3. Therefore, the color points of the manufactured display devices DE may be all aligned with a target color point Pt1. The target color point Pt1 may be the white point D65, for example, but not limited herein.

In some embodiments, the third light-emitting units 500 may be divided into a plurality of groups based on a luminance value, a combination of a peak wavelength value and a luminance value or a color coordinate value of each of the third light-emitting units 500. Furthermore, the third light-emitting units 500 of one of the groups, the first light-emitting units 100 of one of the groups and the second light-emitting units 200 of one of the groups may be transferred to the target substrate SB (referring to FIG. 12) for aligning the color point of the manufactured display device DE with the target color point. The method of dividing groups may be referred to the method of dividing groups for the first light-emitting units 100 and the second light-emitting units 200 in the previous embodiments, and will not be redundantly described herein. Specifically, the first light-emitting units 100 belonging to the first group B1, the second light-emitting units 200 belonging to the fourth group G1 and the third light-emitting units 500 belonging to the seventh group R1 may be transferred to the target substrate SB.

Figure 13:
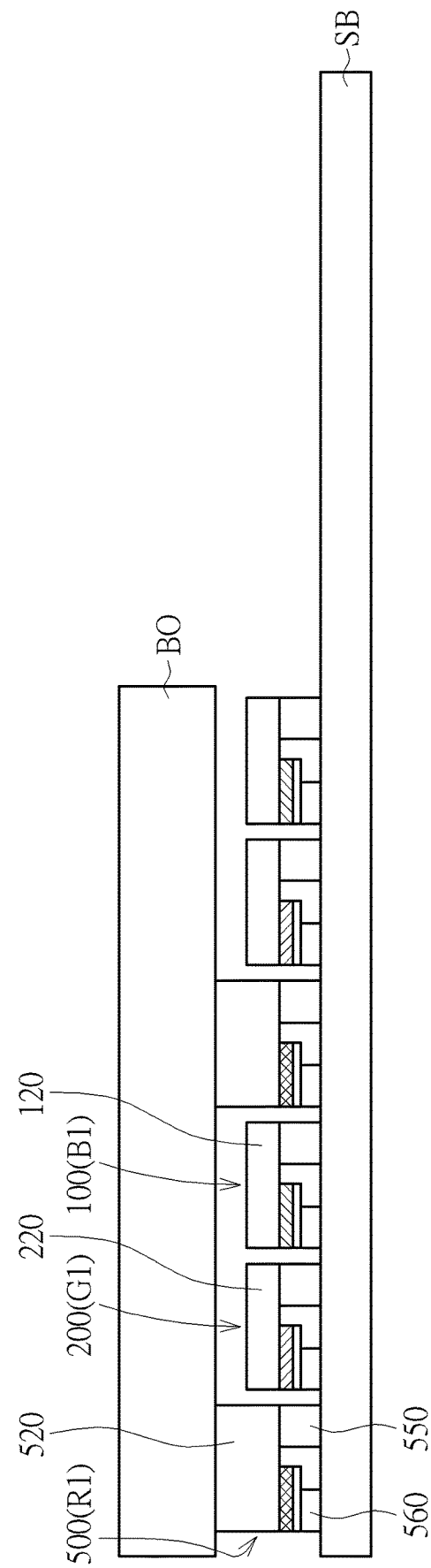

Please refer to FIG. 12 to FIG. 13, cooperated with FIG. 6 to FIG. 9. FIG. 12 to FIG. 13 are schematic diagrams illustrating another part of the process of a method for manufacturing a display device according the present disclosure. As shown in FIG. 9 and the related description above, the portion of the first light-emitting units 100 may be electrically connected to the target substrate SB by the first bonding process. According to some embodiments, as shown in FIG. 9 and the related description above, the first light-emitting units 100 and the second light-emitting units 200 may be electrically connected to the target substrate SB by the first bonding process. In some embodiments, a portion of the first light-emitting units 100 (e.g., the first light-emitting units 100 of the first group B1, the second group B2 or the third group B3) and/or a portion of the second light-emitting units 200 (e.g., the second light-emitting units 200 of the fourth group G1, the fifth group G2 or the sixth group G3) may be electrically connected to the target substrate SB by the first bonding process.

The, the transfer procedure of the third light-emitting units 500 is performed. FIG. 12 shows the process of transferring a portion of the third light-emitting units 500 from a third carrier 600 to the target substrate SB by a transfer element ST. In detail, as shown in FIG. 12, the portion of the third light-emitting units 500 may be transferred from the third carrier 600 to the target substrate SB. For example, the third light-emitting units 500 on the third carrier 600 may be picked by the transfer element ST and then placed on the target substrate SB. Specifically, different portions of the third light-emitting units 500 (e.g., the third light-emitting units 500 of the seventh group R1, the eighth group R2 or the ninth group R3) may be transferred to different third carriers 600 respectively. For example, the third light-emitting units 500 of different groups may be respectively transferred from the growth substrate 510 to different third carriers 600 correspondingly according to a method similar to the method shown in FIG. 6, so that a single third carrier 600 has the third light-emitting units 500 of the same group thereon. Thereafter, the portion of the third light-emitting units 500 is transferred from the third carrier 600 to the target substrate SB.

Then, as shown in FIG. 13, a second bonding process may be performed through a bonding element BO, so as to make the portion of the third light-emitting units 500 electrically connect to the target substrate SB. For example, a portion of the third light-emitting units 500 (e.g., the third light-emitting units 500 of the seventh group R1, the eighth group R2 or the ninth group R3) may be electrically connected to the target substrate SB by the second bonding process. The first electrode 550 and the second electrode 560 of the third light-emitting unit 500 may be electrically connected to the circuits or the electronic elements in the circuit layer (not shown) of the target substrate SB, or the first electrode 550 and the second electrode 560 of the third light-emitting unit 500 may be electrically connected to the circuit layer on the surface of the target substrate SB through the conductive layer (not shown).

According to some embodiments, a portion of the first light-emitting units is electrically connected to the target substrate by the first bonding process, and a portion of the second light-emitting units is electrically connected to the same target substrate by the second bonding process. Specifically, as shown in FIG. 13, the first light-emitting units for the first bonding process may be the blue light-emitting units 100 of the first group B1 and the green light-emitting units 200 of the fourth group G1, and the second light-emitting units for the second bonding process may be the red light-emitting units 500 of the seventh group R1, but the present disclosure is not limited herein. According to some embodiments, the first light-emitting units may be configured to emit blue light, and the second light-emitting units may be configured to emit green light or red light. According to some embodiments, the first light-emitting units may be configured to emit blue light, and the second light-emitting units may be configured to emit green light and/or red light. According to some embodiments, the first light-emitting units may be configured to emit blue light and/or green light, and the second light-emitting units may be configured to emit red light.

In some embodiments, the material included in the first semiconductor layer 520 of the third light-emitting unit 500 may be different from the material included in the first semiconductor layer 120 of the first light-emitting unit 100 and/or the material included in the first semiconductor layer 220 of the second light-emitting unit 200. Thus, the thickness of the first semiconductor layer 520 of the third light-emitting unit 500 may be different from the thickness of the first semiconductor layer 120 of the first light-emitting unit 100 and/or the thickness of the first semiconductor layer 220 of the second-light emitting unit 200. For example, as shown in FIG. 13, the thickness of the first semiconductor layer 520 of the third light-emitting unit 500 may be greater than the thickness of the first semiconductor layer 120 of the first light-emitting unit 100 and greater than the thickness of the first semiconductor layer 220 of the second light-emitting unit 200. Alternatively, the total thickness of the third light-emitting unit 500 may be greater than the total thickness of the first light-emitting unit 100 and greater than the total thickness of the second light-emitting unit 200. Therefore, as described above, the first light-emitting units 100 and the second light-emitting units 200 may be electrically connected to the target substrate SB by the first bonding process, and the third light-emitting units 500 may be electrically connected to the target substrate SB by the second bonding process, but not limited herein. The first bonding process and the second bonding process may be performed at different times. For example, the second bonding process may be performed later than the first bonding process. The first bonding process and the second bonding process may include, for example, heating and pressing steps, but not limited herein.

From the above description, according to the methods for manufacturing display devices of the embodiments of the present disclosure, through predetermining the target color point for the display device and transferring a portion of the first light-emitting units and a portion of the second light-emitting units to the target substrate based on the optical character of each of the light-emitting units, the color point of the manufactured display device may be aligned with the target color point. According to some embodiments, the difference of luminance in the target substrate of the manufactured display device may be reduced, thereby improving the uniformity of the color of the display image.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method for manufacturing a first display device and a second display device, comprising following steps:
providing a plurality of first light-emitting units and a plurality of second light-emitting units, wherein the first light-emitting units are configured to emit light with a first color, and the second light-emitting units are configured to emit light with a second color different from the first color;
obtaining an optical character of each of the first light-emitting units and the second light-emitting units;
predetermining a first target color point for the first display device;
predetermining a second target color point for the second display device;
dividing the first light-emitting units into a first group and a second group, wherein the first group corresponds to optical characters of a first numerical range, the second group corresponds to optical characters of a second numerical range, and the first numerical range is smaller than the second numerical range;
dividing the second light-emitting units into a third group and a fourth group, wherein the third group corresponds to optical characters of a third numerical range, the fourth group corresponds to optical characters of a fourth numerical range, and the third numerical range is smaller than the fourth numerical range;
transferring a portion of the first group of the first light-emitting units and a portion of the third group of the second light-emitting units to a first target substrate of the first display device for aligning a first color point of the first display device with the first target color point.

2. The method according to claim 1, wherein the optical character of each of the first light-emitting units and the second light-emitting units is obtained by performing a test on each of the first light-emitting units and the second light-emitting units.

3. The method according to claim 2, wherein the test is performed by an electroluminescence testing.

4. The method according to claim 2, wherein the test is performed by a photoluminescence testing.

5. The method according to claim 1, wherein transferring the portion of the first group of the first light-emitting units and the portion of the third group of the second light-emitting units to the first target substrate comprises:
transferring the portion of the first group of the first light-emitting units to a first carrier;
transferring the portion of the third group of the second light-emitting units to a second carrier;
transferring the portion of the first group of the first light-emitting units from the first carrier to the first target substrate; and
transferring the portion of the third group of the second light-emitting units from the second carrier to the first target substrate.

6. The method according to claim 5, wherein the portion of the first group of the first light-emitting units is transferred from at least two growth substrates.

7. The method according to claim 1, further comprising:
providing a plurality of third light-emitting units, wherein the third light-emitting units are configured to emit light with a third color different from the first color and the second color;
obtaining an optical character of each of the third light-emitting units; and
transferring a portion of the third light-emitting units to the first target substrate,
wherein the first target color point is a target white point.

8. The method according to claim 7, wherein the optical character of each of the third light-emitting units is obtained by performing a test on each of the third light-emitting units.

9. The method according to claim 1, wherein one of the portion of the first group of the first light-emitting units has a first peak wavelength, another one of the portion of the first group of the first light-emitting units has a second peak wavelength, and a difference between the first peak wavelength and the second peak wavelength is less than 2 nm.

10. The method according to claim 1, wherein the optical character is a peak wavelength value.

11. The method according to claim 1, wherein the optical character is a luminance value.

12. The method according to claim 1, wherein the optical character is a combination of a peak wavelength value and a luminance value.

13. The method according to claim 1, wherein the optical character is a color coordinate value.

14. The method according to claim 1, further comprising:
making the portion of the first group of the first light-emitting units electrically connect to the first target substrate by a first bonding process; and
making the portion of the third group of the second light-emitting units electrically connect to the first target substrate by a second bonding process.

15. The method according to claim 1, wherein the first color is blue, and the second color is green or red.

16. The method according to claim 10, wherein the peak wavelength values corresponding to the first group are smaller than the peak wavelength values corresponding to the second group, and the peak wavelength values corresponding to the third group are smaller than the peak wavelength values corresponding to the fourth group.

17. A method for manufacturing a first display device, a second display device and a third display device, comprising following steps:
providing a plurality of first light-emitting units and a plurality of second light-emitting units, wherein the first light-emitting units are configured to emit light with a first color, and the second light-emitting units are configured to emit light with a second color different from the first color;
obtaining an optical character of each of the first light-emitting units and the second light-emitting units;
predetermining a first target color point for the first display device;
predetermining a second target color point for the second display device;
predetermining g a third target color point for the third display device;
dividing the first light-emitting units into a first group, a second group and a third group, wherein the first group corresponds to optical characters of a first numerical range, the second group corresponds to optical characters of a second numerical range, and the third group corresponds to optical characters of a third numerical range, wherein the first numerical range is smaller than the second numerical range, and the second numerical range is smaller than the third numerical range,
dividing the second light-emitting units into a fourth group, a fifth group and a sixth group, wherein the fourth group corresponds to optical characters of a fourth numerical range, the fifth group corresponds to optical characters of a fifth numerical range, and the sixth group corresponds to optical characters of a sixth numerical range, wherein the fourth numerical range is smaller than the fifth numerical range, and the fifth numerical range is smaller than the sixth numerical range;
transferring a portion of the first group of the first light-emitting units and a portion of the fourth group of the second light-emitting units to a first target substrate for aligning a first color point of the first display device with the first target color point;
transferring a portion of the second group of the first light-emitting units and a portion of the fifth group of the second light-emitting units to a second target substrate for aligning a second color point of the second display device with the second target color point;
and transferring a portion of the third group of the first light-emitting units and a portion of the sixth group of the second light-emitting units to a third target substrate for aligning a third color point of the third display device with the third target color point,
wherein the optical character comprises a peak wavelength value, the peak wavelength values corresponding to the first group are smaller than the peak wavelength values corresponding to the second group, the peak wavelength values corresponding to the second group are smaller than the peak wavelength values corresponding to the third group, the peak wavelength values corresponding to the fourth group are smaller than the peak wavelength values corresponding to the fifth group, and the peak wavelength values corresponding to the fifth group are smaller than the peak wavelength values corresponding to the sixth group.

* * * * *